(12) United States Patent
Maurino

(10) Patent No.: US 9,312,825 B2
(45) Date of Patent: Apr. 12, 2016

(54) AMPLIFIER INPUT STAGE AND AMPLIFIER

(71) Applicant: Analog Devices Global, Hamilton (BM)

(72) Inventor: Roberto S. Maurino, Turin (IT)

(73) Assignee: Analog Devices Global, Hamilton (BM)

( * ) Notice: Subject to any disclaimer, the term of this patent is extended or adjusted under 35 U.S.C. 154(b) by 32 days.

(21) Appl. No.: 14/274,258

(22) Filed: May 9, 2014

(65) Prior Publication Data
US 2015/0326193 A1 Nov. 12, 2015

(51) Int. Cl.
*H03F 3/45* (2006.01)
*H03F 1/26* (2006.01)

(52) U.S. Cl.
CPC .............. *H03F 3/45076* (2013.01); *H03F 1/26* (2013.01); *H03F 2200/234* (2013.01); *H03F 2203/45116* (2013.01)

(58) Field of Classification Search
CPC ........................................................ H03F 3/45
USPC .................................................. 330/253, 261
See application file for complete search history.

(56) References Cited

U.S. PATENT DOCUMENTS

| 6,380,801 | B1 | 4/2002 | McCartney | |
|---|---|---|---|---|
| 8,330,537 | B1 * | 12/2012 | Ghorpade et al. | 330/9 |
| 2013/0021101 | A1 * | 1/2013 | Frey | 330/257 |

OTHER PUBLICATIONS

Huijsing, Johan H., and Linebarger, Daniel, "Low-Voltage Operational Amplifier with Rail to-Rail Input and Output Ranges," IEEE Journal of Solid-State Circuits, vol. sc-20, No. 6., Dec. 1985, pp. 1144-1150.
Fisher, John A., and Koch, Rudolf, "A Highly Linear CMOS Buffer Amplifier," IEEE Journal of Solid-State Circuits, vol. sc-22, No. 3, Jun. 1987, pp. 330-334.
Pardoen, M. D., et al., "A Rail-to-Rail Input/Output CMOS Power Amplifier," IEEE Journal of Solid-State Circuits, vol. 25, No. 2, Apr. 1990, pp. 501-504.

* cited by examiner

*Primary Examiner* — Steven J Mottola
(74) *Attorney, Agent, or Firm* — Knobbe, Martens, Olson & Bear LLP

(57) ABSTRACT

An amplifier input stage comprising first and second p-type transistors, wherein sources of the first and second p-type transistors are connected to a first node, a drain of the first p-type transistor is connected to a first output of the amplifier input stage, a drain of the second p-type transistor is connected to a second output of the amplifier input stage, a gate of the first p-type transistor is configured to receive a first signal of an input stage differential input signal and a gate of the second p-type transistor is configured to receive a second signal of the input stage differential input signal; first and second n-type transistors, wherein sources of the first and second n-type transistors are connected to a second node, a drain of the first n-type transistor is connected to a third output of the amplifier input stage, a drain of the second n-type transistor is connected to a fourth output of the amplifier input stage, a gate of the first n-type transistor is configured to receive the first signal of the input stage differential input signal and a gate of the second n-type transistor is configured to receive the second signal of the input stage differential input signal; a first circuit arranged to provide a first portion of a first bias current to the first node; and a second circuit arranged to draw a second portion of the first bias current from the second node; wherein the first and second portions are determined by a first signal of an amplifier input signal.

20 Claims, 5 Drawing Sheets

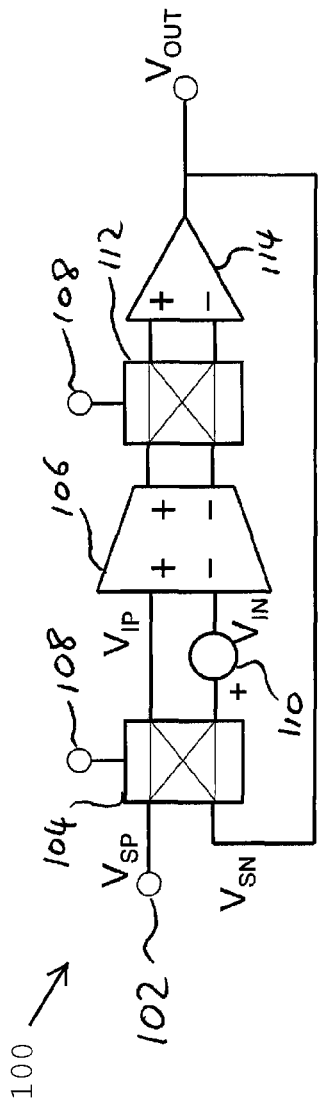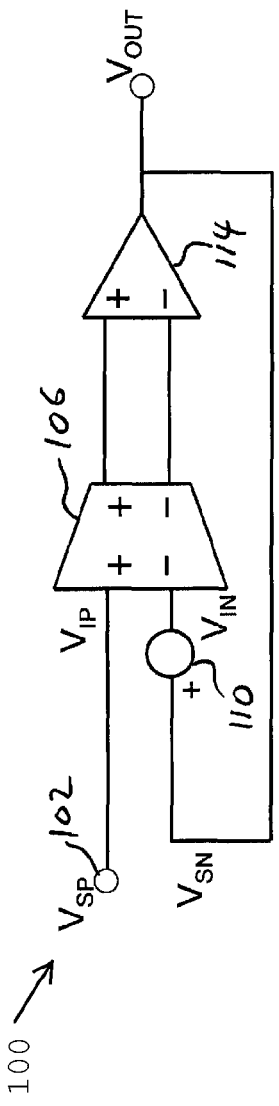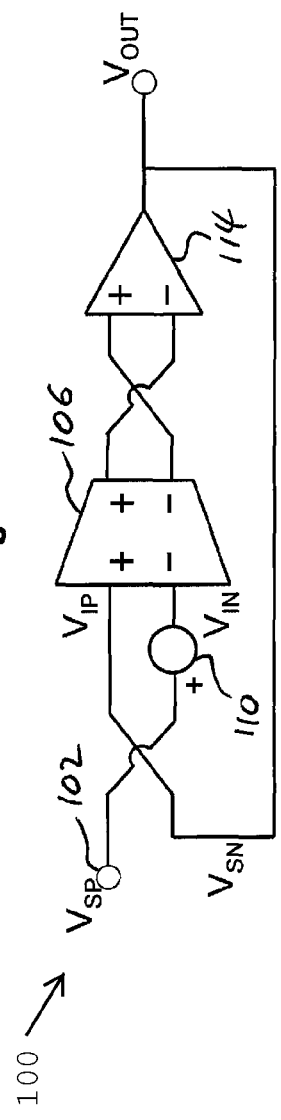

US 9,312,825 B2

AMPLIFIER INPUT STAGE AND AMPLIFIER

TECHNICAL FIELD

The present application relates to amplifiers and, for example, to amplifier input stages.

BACKGROUND

Ideally, if both inputs of an operational amplifier (op-amp) are at exactly the same voltage, then the output should be at zero volts. In practice, a small differential voltage is applied to the inputs to cause the output to be zero volts. This differential voltage is known as the input offset voltage. The input offset voltage can be modelled as a voltage source in series with the inverting terminal of the op-amp and providing a constant voltage $V_{OS}$.

Chopped amplifiers can be used to reduce or eliminate the effects of the input offset voltage $V_{OS}$. A chopped amplifier can include, for example, an op-amp. Chopped amplifiers can operate in two phases in which a chopper selectively reverses the order of first and second differential inputs as outputs responsive to a control signal.

U.S. Pat. No. 6,380,801, the contents of which are incorporated herein by reference for all purposes, describes an operational amplifier having two differential input stages.

Johan H. Huijsing et al., "Low-Voltage Operational Amplifier with Rail-to-Rail Input and Output Ranges," IEEE Journal of Solid-State Circuits, vol. sc-20, No. 6., December 1985, pp. 1144-1150, the contents of which are incorporated herein by reference for all purposes, describes an operational amplifier that can perform signal operations in nearly the full supply voltage range.

John A. Fisher et al., "A Highly Linear CMOS Buffer Amplifier," IEEE Journal of Solid-State Circuits, vol. sc-22, No. 3, June 1987, pp. 330-334, the contents of which are incorporated herein by reference for all purposes, describes a CMOS buffer amplifier that achieves improvements in linearity and drive capability over previously reported high-swing amplifiers.

M. D. Pardoen et al., "A Rail-to-Rail Input/Output CMOS Power Amplifier," IEEE Journal of Solid-State Circuits, vol. 25, No. 2, April 1990, pp. 501-504, the contents of which are incorporated herein by reference for all purposes, describes a rail-to-rail amplifier that maintains a high common-mode rejection ratio (CMRR) over the whole common-mode range and has a low harmonic distortion despite the use of relatively small output devices.

SUMMARY OF CERTAIN INVENTIVE ASPECTS

According to a first aspect, there is provided an amplifier input stage comprising first and second p-type transistors. Sources of the first and second p-type transistors are connected to a first node, a drain of the first p-type transistor is connected to a first output of the amplifier input stage, a drain of the second p-type transistor is connected to a second output of the amplifier input stage, a gate of the first p-type transistor is configured to receive a first signal of an input stage differential input signal and a gate of the second p-type transistor is configured to receive a second signal of the input stage differential input signal. The amplifier input stage includes first and second n-type transistors, wherein sources of the first and second n-type transistors are connected to a second node, a drain of the first n-type transistor is connected to a third output of the amplifier input stage, a drain of the second n-type transistor is connected to a fourth output of the amplifier input stage, a gate of the first n-type transistor is configured to receive the first signal of the input stage differential input signal and a gate of the second n-type transistor is configured to receive the second signal of the input stage differential input signal. The amplifier input stage also includes a first circuit arranged to provide a first portion of a first bias current to the first node, and a second circuit arranged to draw a second portion of the first bias current from the second node. The first and second portions are determined by a first signal of an amplifier input signal.

In some embodiments the first bias current is substantially fixed and/or comprises the first portion and the second portion. Therefore, for example, the bias current is split between the two pairs of transistors, and the portion of the bias current provided to each of these transistors is determined based on the first signal of the differential input signal. In some embodiments, the first and second portions of the first bias current are not determined by at least one of the second signal of the differential input signal and a common mode of the differential input signal.

The first circuit may be at least one current source. Additionally or alternatively, the second circuit may be at least one current source. The first and/or second circuit may instead comprise at least one current mirror that mirrors a current provided elsewhere.

The amplifier input stage may comprise a third circuit for determining the first and second portions of the bias current, the third circuit comprising a current source arranged to draw a second bias current from a third node. The amplifier input stage may also comprise third and fourth n-type transistors, wherein sources of the third and fourth transistors are connected to the third node, a drain of the third transistor is connected to the at least one first current mirror, a gate of the third transistor is connected to a threshold voltage, a drain of the fourth transistor is connected to the at least one second current mirror and a gate of the fourth transistor is connected to one of the first and second signals of the differential input signal. The at least one first current mirror can be arranged to induce the first portion of the first bias current proportional to a drain-source current of the third n-type transistor, and the at least one second current mirror can be arranged to induce the second portion of the first bias current proportional to a drain-source current of the fourth n-type transistor.

Alternatively, the third circuit may comprise a current source arranged to provide a second bias current to a third node. The amplifier input stage may also comprise third and fourth p-type transistors, wherein sources of the third and fourth transistors are connected to the third node, a drain of the third transistor is connected to the at least one first current mirror, a gate of the third transistor is connected to one of the first and second signals of the differential input signal, a drain of the fourth transistor is connected to the at least one second current mirror and a gate of the fourth transistor is connected to a threshold voltage. The at least one first current mirror can be arranged to induce the first portion of the first bias current proportional to a source-drain current of the third p-type transistor, and the at least one second current mirror can be arranged to induce the second portion of the first bias current proportional to a source-drain current of the fourth p-type transistor.

The amplifier input stage may include at least one of a first active load p-type transistor with a source connected to a first power supply voltage, a drain connected to the fourth output of the amplifier input stage, and a gate connected to the second circuit. The second circuit and the first active load p-type transistor can be arranged to provide substantially half of the second portion of the first bias current to the fourth output of the amplifier input stage. A second active load p-type transistor can be provided with a source connected to the first power supply voltage, a drain connected to the third output of the amplifier input stage, and a gate connected to the second circuit, wherein the second circuit and the second active load p-type transistor can be arranged to provide substantially half of the second portion of the first bias current to the third output of the amplifier input stage. A first active load n-type transistor can be provided with a source connected to a second power supply voltage, a drain connected to the second output of the amplifier input stage, and a gate connected to the first circuit, wherein the first circuit and the first active load n-type transistor can be arranged to draw substantially half of the first portion of the first bias current from the second output of the amplifier input stage. A second active load n-type transistor can be provided with a source connected to the second power supply voltage, a drain connected to the first output of the amplifier input stage, and a gate connected to the first circuit, wherein the first circuit and the second active load n-type transistor can be arranged to draw substantially half of the first portion of the first bias current from the first output of the amplifier input stage. The active load devices may effectively reduce or eliminate the common mode current component from one or more of the outputs of the amplifier input stage.

According to a second aspect, there is provided an amplifier comprising: an amplifier input stage comprising first and second p-type transistors, wherein sources of the first and second p-type transistors are connected to a first node, a drain of the first p-type transistor is connected to a first output of the amplifier input stage, a drain of the second p-type transistor is connected to a second output of the amplifier input stage, a gate of the first p-type transistor is configured to receive a first signal of an input stage differential input signal and a gate of the second p-type transistor is configured to receive a second signal of the input stage differential input signal. The amplifier input stage also includes first and second n-type transistors, wherein sources of the first and second n-type transistors are connected to a second node, a drain of the first n-type transistor is connected to a third output of the amplifier input stage, a drain of the second n-type transistor is connected to a fourth output of the amplifier input stage, a gate of the first n-type transistor is configured to receive the first signal of the input stage differential input signal and a gate of the second n-type transistor is configured to receive the second signal of the input stage differential input signal. A first circuit is arranged to provide a first portion of a first bias current to the first node. A second circuit is arranged to draw a second portion of the first bias current from the second node. The first and second portions are determined by a first signal of an amplifier input signal. The amplifier further comprises a further amplifier stage coupled to the first, second, third and fourth outputs of the amplifier input stage. The amplifier may be an operational amplifier. The amplifier may be incorporated into an electronic device, such as a chopper amplifier for example.

According to another aspect, a chopper amplifier is provided including a first chopper configured to receive first and second inputs, wherein the first input comprises a first signal of an amplifier input signal, and to provide first and second outputs, wherein the first chopper selectively reverses the order of the first and second inputs at the first and second outputs. An amplifier according to the second aspect is configured to receive the first and second outputs of the first chopper and provide first and second amplifier outputs. A second chopper is configured to receive the first and second amplifier outputs and to provide first and second outputs, wherein the second chopper selectively reverses the order of the first and second amplifier outputs at the first and second outputs of the second chopper. The first and second choppers may be synchronously controlled.

BRIEF DESCRIPTION OF THE DRAWINGS

Embodiments will now be described by way of example only with reference to the accompanying figures, in which:
FIG. 1 shows an example of a chopped amplifier;
FIG. 2 shows an example of the configuration of the chopped amplifier of FIG. 1 in a first chop phase;
FIG. 3 shows an example of the configuration of the chopped amplifier of FIG. 1 in a second chop phase.

DETAILED DESCRIPTION OF THE CERTAIN EMBODIMENTS

Figure 4:
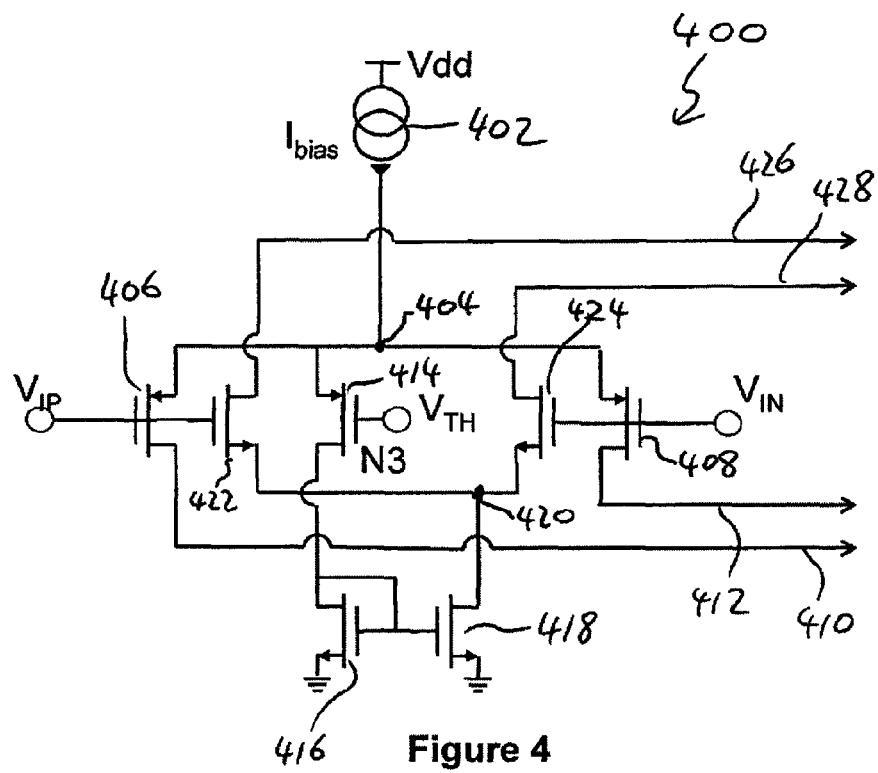
FIG. 4 shows an example of an amplifier input stage.

FIG. 1 shows an example of a chopped amplifier 100 that is configured as a unity buffer, though the other configurations are possible. The chopped amplifier 100 includes an input terminal 102 for receiving a single-ended input signal $V_{SP}$. The input signal $V_{SP}$ is provided to one input of a chopper 104. The output signal $V_{OUT}$ of the chopped amplifier 100 is provided to the other input of the chopper 104. The outputs of the chopper 104 are provided to the inverting and non-inverting inputs of a differential input differential output gain stage 106, such as an op-amp. Embodiments of the gain stage 106 are discussed in more detail below. The chopper 104 selectively reverses the order of the first and second inputs at its differential outputs, according to the state of a control signal provided to input terminal 108. In a second phase, the chopper 104 reverses the order of its inputs relative to a first phase. For example, in the first phase the input signal $V_{SP}$ is connected to the non-inverting input of the gain stage 106, and in the second phase the input signal $V_{SP}$ is connected to the inverting input of the gain stage 106. The input offset voltage of the gain stage 106 is modeled as a voltage source 110 in series with the inverting input of the gain stage 106.

The outputs of the gain stage 106 are provided to a second chopper 112 and the outputs of the second chopper 112 are connected to a differential input single ended output buffer 114, which provides the output signal $V_{OUT}$. The second chopper 112 may be controlled by the same control signal as the first chopper 104.

FIG. 2 shows an example of the effective configuration of the chopped amplifier 100 of FIG. 1 when the choppers 104, 112 are controlled in the first phase, and FIG. 3 shows an example of the effective configuration of the chopped amplifier 100 in the second phase.

If the gain of the differential input differential output gain stage 106 is considered to be very large, and the offset voltage $V_{OS}$ is the input offset voltage as shown by the voltage source 110, then in the first phase:

$$V_{OUT}=V_{SP}V_{OS} \quad (1)$$

In the second phase:

$$V_{OUT}=V_{SP}-V_{OS} \quad (2)$$

Therefore, if the offset voltage $V_{OS}$ of the gain stage 106 does not change between the first and second phases, and the lengths of the first and second phases are substantially equal, then taking an average of the output signal $V_{OUT}$ or filtering this signal can substantially eliminate the offset voltage $V_{OS}$.

FIG. 4 shows an example of a known rail-to-rail input stage 400 of a gain stage such as gain stage 106 shown in FIGS. 1 to 3. The input stage 400 includes a current source 402 connected between a supply voltage Vdd and a node 404. As illustrated, the input stage 400 is arranged to supply a bias current $I_{bias}$ to the node 404. A pair of PMOS transistors 406 and 408 have their sources connected to the node 404. The gate of transistor 406 corresponds to a non-inverting input of the amplifier input stage and receives a first signal $V_{IP}$ of a differential input signal to the gain stage 400. The gate of transistor 408 corresponds to an inverting input of the amplifier input stage and receives a second signal $V_{IN}$ of the differential input signal to the gain stage 400. The drain of transistor 406 corresponds to a first output 410 of the input stage 400, and the drain of transistor 408 corresponds to a second output 412. In a first chop phase of a chopped amplifier incorporating the gain stage, the signals $V_{IP}$ and $V_{IN}$ correspond to the signals $V_{SP}$ and $V_{SN}$ input to the amplifier respectively, whereas in a second chop phase they correspond to signals $V_{SN}$ and $V_{SP}$, respectively.

The node 404 is also connected to the source of a further PMOS transistor 414. Its gate is connected to a fixed threshold voltage $V_{TH}$, and its drain is connected to the drain and gate of NMOS transistor 416 and the gate of NMOS transistor 418. The sources of transistors 416 and 418 are connected to ground. The drain of transistor 418 is connected to a node 420.

A pair of NMOS transistors 422 and 424 have their sources connected to the node 420. The gate of transistor 422 corresponds to the non-inverting input of the amplifier input stage and receives the first signal $V_{IP}$ of the differential input signal. The gate of transistor 424 corresponds to an inverting input of the amplifier input stage and receives the second signal $V_{IN}$ of the differential input signal. The drain of transistor 422 corresponds to a third output 426 of the input stage 400, and the drain of transistor 424 corresponds to a fourth output 428.

In operation, a differential signal to be amplified is provided as voltages $V_{IP}$ and $V_{IN}$ to the amplifier input stage 400. The voltages $V_{IP}$ and $V_{IN}$ have a common mode voltage. If this common mode voltage is well below $V_{TH}$, substantially all of the bias current $I_{bias}$ will flow through the PMOS transistors 406 and 408, and no bias current or substantially no bias current flows through the NMOS transistors 422 and 424. In this scenario, the input offset voltage $V_{OS}$ of the input stage 400, and therefore an amplifier including the input stage 400, is dominated by the offset of PMOS input pair 406 and 408.

If the common mode voltage is well above $V_{TH}$, substantially all of the bias current $I_{bias}$ flows through transistor 414 and is mirrored by transistors 416 and 418 through the NMOS transistors 422 and 424, whereas no current or substantially no current flows through the PMOS transistors 406 and 408. In this scenario, the input offset voltage $V_{OS}$ of the input stage 400, and therefore an amplifier including the input stage 400, is dominated by NMOS input pair 422 and 424.

If the input common mode voltage is close to $V_{TH}$, some bias current will flow through PMOS transistors 406 and 408 as well as NMOS transistors 422 and 424, and both pairs will contribute to the input offset voltage $V_{OS}$. The threshold voltage $V_{TH}$ is selected so that the PMOS input transistor pair 406 and 408 and/or the NMOS input transistor pair 422 and 424 are fully on for any value for the input common mode voltage.

Therefore, the input offset voltage $V_{OS}$ of a rail to rail input stage of FIG. 3 can be a function of the input common mode voltage of the differential input signal. Considering again the chopped amplifier of FIG. 1, the common mode voltage $V_{CIM1}$ of the input signal to the gain stage 106 in chop phase 1, i.e., the common mode voltage of $V_{SP}$ and $V_{SN}$, can be expressed as:

$$V_{CIM1}=(V_{SP}+V_{SN})/2=V_{SP}+V_{OS}/2 \quad (3)$$

In chop phase 2, the common mode voltage $V_{CIM2}$ can be expressed as:

$$V_{CIM2}=(V_{SP}+V_{SN})/2=V_{SP}-V_{OS}/2 \quad (4)$$

As a result, the common mode voltage of the inputs to the gain stage 106 changes between chop phases, and thus the input offset voltage $V_{OS}$ may also change between chop phases. It follows that averaging the output of the amplifier over multiple chop phases may not completely eliminate the offset voltage $V_{OS}$, and a residual offset voltage occurs.

Figure 5:
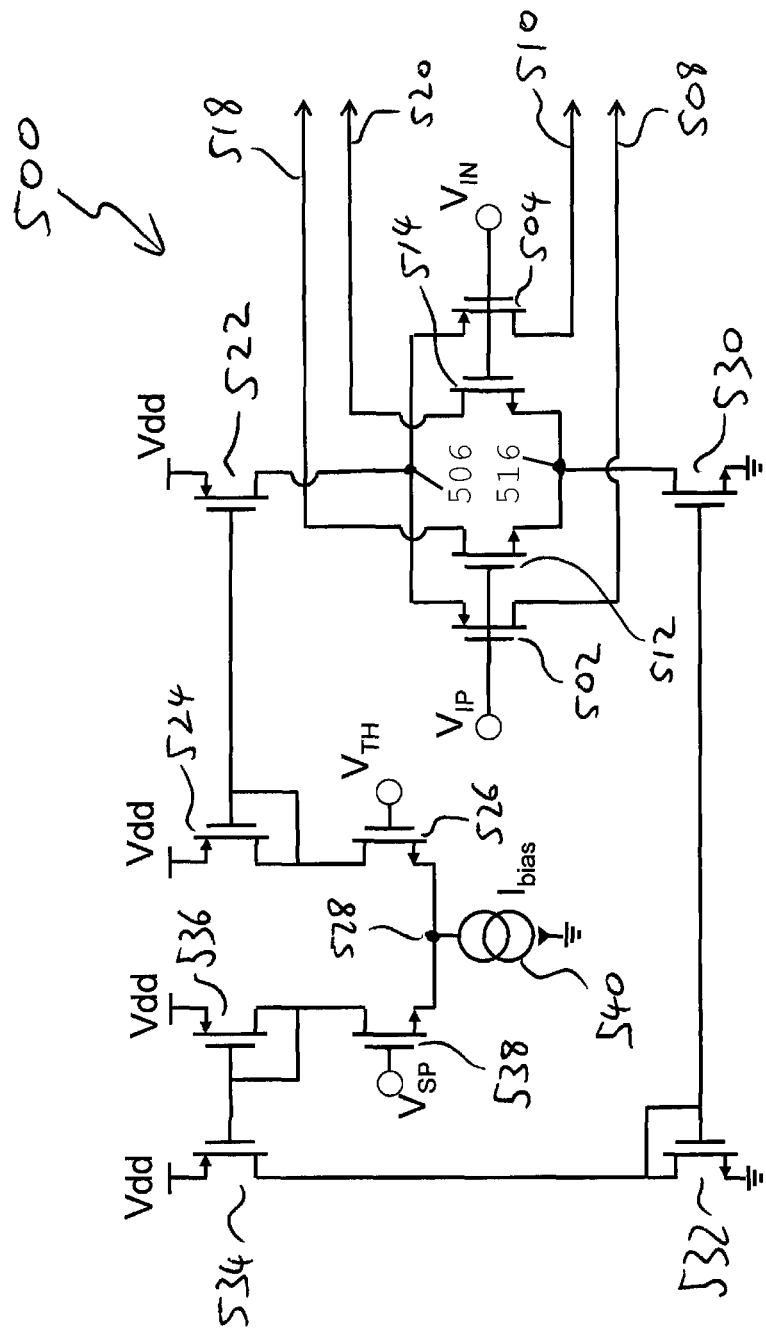
FIG. 5 shows another example of an amplifier input stage.

FIG. 5 shows an amplifier input stage 500 that may reduce or eliminate this problem, among others. In some applications, the amplifier input stage 500 together with a combining circuit, which can combine the four outputs of the amplifier input stage 500 into a differential pair of outputs, can serve as the input stage of an amplifier, for example as the input stage 106 of the chopped amplifier 100 of FIGS. 1 to 3. The amplifier input stage 500 can include more or fewer elements than illustrated. The amplifier input stage 500 includes a pair of PMOS transistors 502 and 504 having their sources connected to a node 506, which can be referred to as the first node. The gate of transistor 502 corresponds to a non-inverting input of the amplifier input stage 500 and receives a first signal $V_{IP}$ of a differential input signal. The gate of transistor 504 corresponds to an inverting input of the amplifier input stage 500 and receives a second signal $V_{IN}$ of the differential input signal. The drain of transistor 502 corresponds to a first output 508 of the amplifier input stage 500, and the drain of transistor 504 corresponds to a second output 510 of the amplifier input stage 500.

A pair of NMOS transistors 512 and 514 have their sources connected to the node 516, which can be referred to as the second node. The gate of transistor 512 corresponds to the non-inverting input of the amplifier input stage 500 and receives the first signal $V_{IP}$ of the differential input signal. The gate of transistor 514 corresponds to an inverting input of the amplifier input stage 500 and receives the second signal $V_{IN}$ of the differential input signal. The drain of transistor 512 corresponds to a third output 518 of the amplifier input stage 500, and the drain of transistor 514 corresponds to a fourth output 520 of the amplifier input stage 500.

Current can be supplied to the node 506 by a first circuit that comprises a current mirror in the example shown in FIG. 5. This current mirror comprises a PMOS transistor 522 that has its source connected to a supply voltage Vdd, a drain connected to the node 506 and a gate connected to the gate and drain of a further PMOS transistor 524. The source of transistor 524 is connected to Vdd and its gate and drain are also connected to the drain of a NMOS transistor 526. The source of NMOS transistor 526 is connected to a node 528, and its gate receives a threshold voltage $V_{TH}$.

Current can be drawn from the node 516 by a second circuit that comprises two current mirrors in the example shown in FIG. 5. These current mirrors comprise a NMOS transistor 530 with a source connected to ground, a drain connected to the node 516 and a gate connected to the gate and drain of a NMOS transistor 532. The NMOS transistor 532 has a source connected to ground and its gate and drain are also connected to the drain of a PMOS transistor 534. The PMOS transistor 534 has a source connected to the supply voltage Vdd and a gate connected to the gate and drain of a PMOS transistor 536.

The source of the PMOS transistor 536 is connected to Vdd and its gate and drain are also connected to the drain of a NMOS transistor 538. The source of the NMOS transistor 538 is connected to the node 528 and its gate in the example shown in FIG. 5 receives a signal $V_{SP}$ which is one signal, for example the positive signal, of a differential input signal provided to an amplifier, such as the chopped amplifier 100 (FIGS. 1-3), that incorporates the input stage 500. For example, in some implementations, the signal $V_{SP}$ corresponds to the non-inverting input of the amplifier input stage 500. In other implementations, for example a chopped amplifier, the signals $V_{IP}$ and $V_{IN}$ may correspond to signals after a first chopper stage and the signal $V_{SP}$ may correspond to an input signal to the chopped amplifier before the first chopper stage.

In the illustrated amplifier input stage 500, a current source 540 is connected between the node 528 and ground and draws a bias current $I_{bias}$ from the node 528.

In operation, a portion of the bias current $I_{bias}$ flows through the transistor 538 depending on the fixed threshold voltage $V_{TH}$ and the signal $V_{SP}$. The remaining portion of the bias current flows through the transistor 526. The current flowing through transistor 538 is mirrored by transistors 536 and 534 and then mirrored by transistors 532 and 530. Current is then drawn from the node 516. In this example, the current mirrors of the second circuit each have a 1:1 ratio such that the same portion of current flowing through the transistor 538 is drawn from node 516, although the ratio may be different in other embodiments. Thus, the portion of current drawn from node 516 is drawn through NMOS transistors 512 and 514.

The remaining portion of the bias current $I_{bias}$ is mirrored by transistors 524 and 522 and is provided to the node 506. In the example described herein, the current mirror of the first circuit has a 1:1 ratio such that the same portion of current is provided to node 506, although the ratio may be different in other embodiments. Thus, the portion of current that flows through the node 506 flows through PMOS transistors 502 and 504. In the amplifier input stage 500 shown in FIG. 5, the portions of the bias current $I_{bias}$ from the current source 540 flowing through the first node 506 and the second node 516, respectively, are controlled responsive to the input signal $V_{SP}$ of the amplifier that includes the amplifier input stage 500.

As a result, the bias currents flowing through the input transistors 502, 504, 512 and 514, and thus the input offset signal $V_{OS}$ of the amplifier input stage 500, do not depend on the common mode voltage of the input signals $V_{IP}$ and $V_{IN}$, or the signals $V_{SP}$ and $V_{SN}$ (where $V_{SN}$ corresponds to the other signal of the differential input signal when the gain stage is included in a chopped amplifier, for example), but instead only on the input signal $V_{SP}$. Therefore, if the amplifier input stage 500 is used as part of an amplifier component (e.g., a gain stage, such as the gain stage 106 of FIGS. 1 to 3) in a chopped amplifier, the input offset voltage does not change between chop phases and the residual offset voltage of an averaged or filtered output of the chopped amplifier is reduced or eliminated. In some implementations, such as a single-ended amplifier for example, the input signal $V_{SN}$ to the amplifier may be the output signal $V_{OUT}$ as shown in FIGS. 1-3 for example.

In the example of FIG. 5, the threshold voltage $V_{TH}$ is set at a voltage that ensures that the transistors 522 and 530 are fully on (e.g., operating in the saturation region) in a region of the voltage $V_{SP}$ that gives a transition between the transistors 502 and 504 being fully on and the transistors 512 and 514 being fully on. $V_{TH}$ may, for example, be chosen as half of the supply voltage Vdd. Therefore, for example, where Vdd is 5V, $V_{TH}$ may be set at 2.5V.

FIG. 5 shows an example implementation of the amplifier input stage 500, although other implementations of the amplifier input stage 500 and the other amplifier input stages discussed herein (such as the amplifier input stage 700) are possible and would be evident to a person skilled in the art. For example, PMOS and NMOS devices may be interchanged with appropriate reconfiguration of some other components of the circuit, such as power rails. Additionally or alternatively, for example, other implementations for copying the current through transistor 526 and/or 538 to the respective nodes 506 and/or 516 could be used, or these currents could even be drawn from either or both of these nodes with appropriate circuit reconfiguration. Additionally or alternatively, for example, the transistor 538 could have its gate connected to a different signal from that illustrated. For example, the gate could instead be connected to a substantially constant signal that is related to the input to an amplifier incorporating the input stage 500. For example, the gate could be connected to the input, one of the inputs (if there are multiple inputs), a voltage proportional to any of these signals, or some other signal as appropriate to ensure that the residual offset is reduced or eliminated from the output of the amplifier over time. In each of these examples, a first portion of a first bias current $I_{bias}$ provided to the first node 506 and a second portion of the first bias current $I_{bias}$ from the second node 516 are determined by one of the amplifier input signals.

Figure 6:
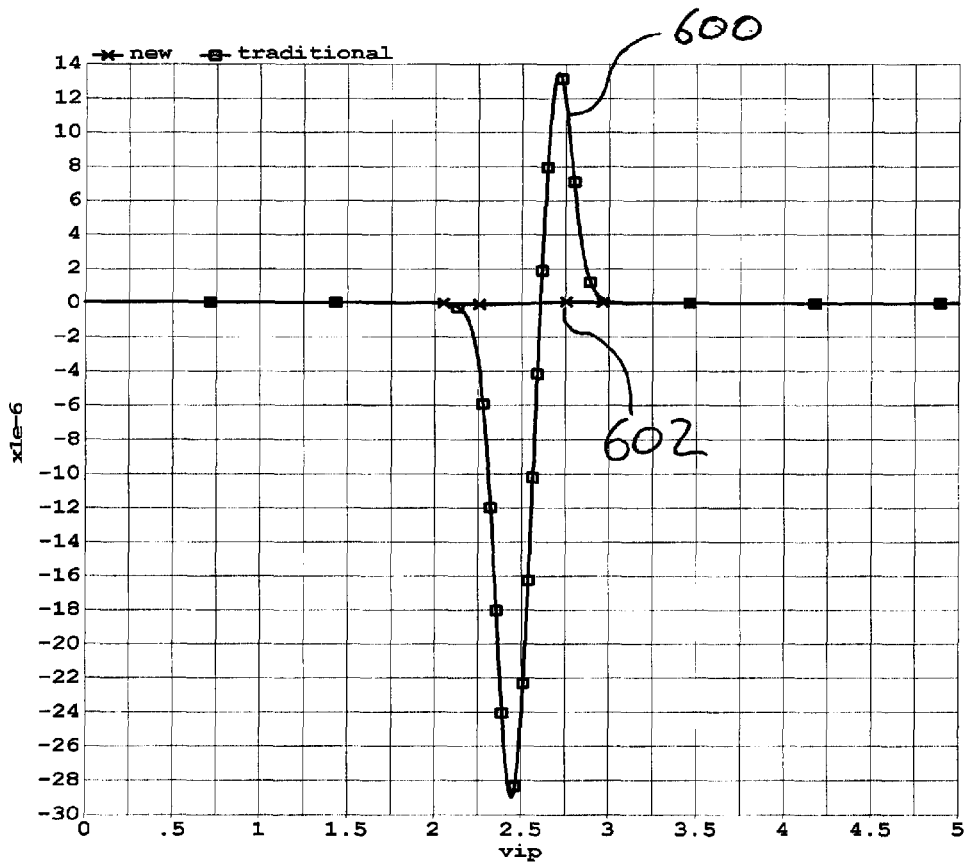
FIG. 6 shows a graph comparing the performance of the amplifier input stages of FIGS. 4 and 5.

FIG. 6 shows examples of the residual offset voltage of a chopped amplifier that incorporates either the amplifier input stage 400 of FIG. 4 or the amplifier input stage 500 of FIG. 5. The threshold voltage $V_{TH}$ is set at 2.5V. A curve 600 shows that when the input signal $V_{SP}$ is near the threshold voltage $V_{TH}$, a residual offset voltage occurs in the chopped amplifier that incorporates the known amplifier input stage 400. In contrast, as shown by curve 602, the residual offset voltage has been almost completely eliminated in a chopped amplifier that includes the amplifier input stage 500 of the embodiment of FIG. 5.

Figure 7:
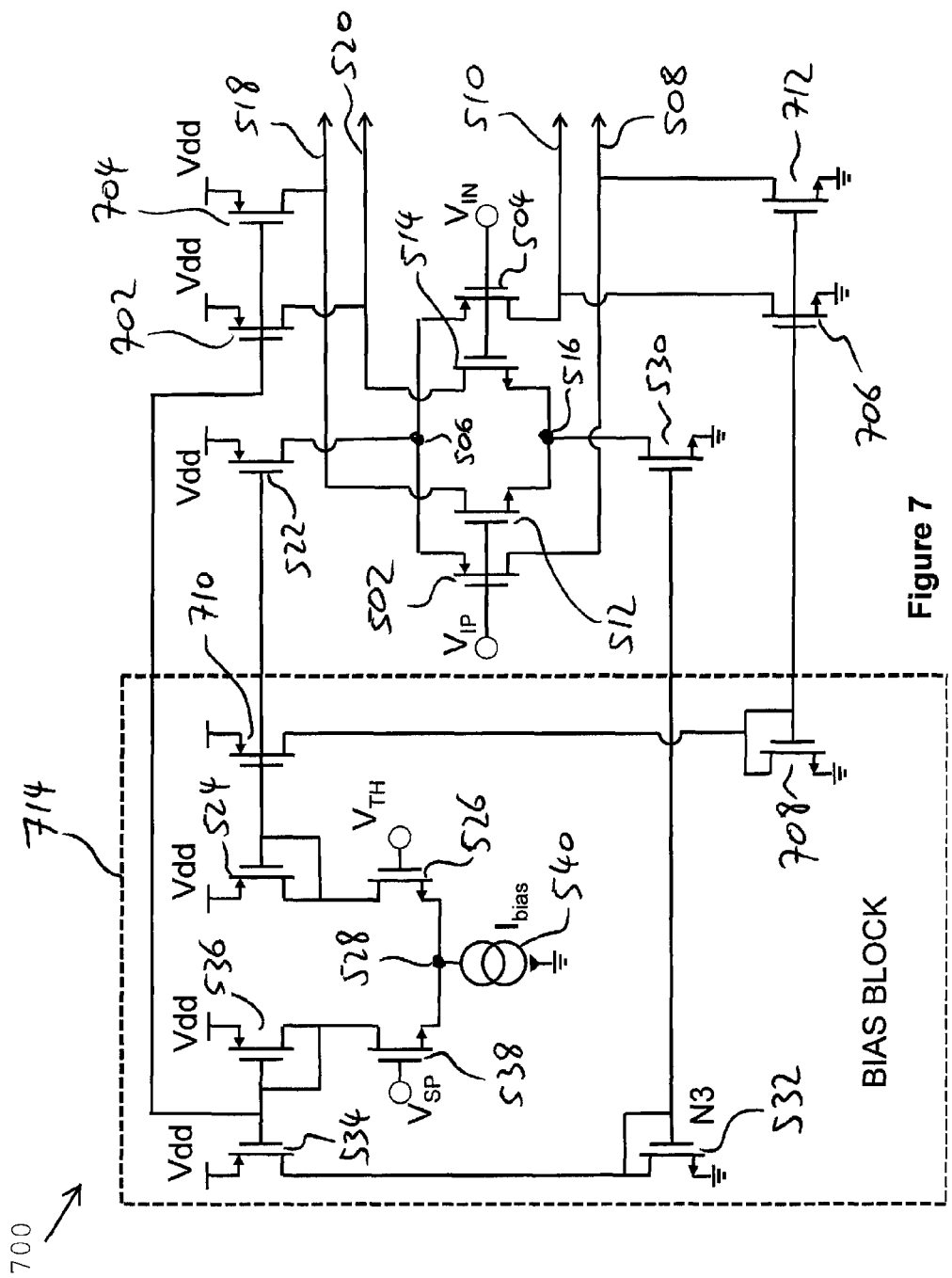
FIG. 7 shows a further example of an amplifier input stage.

FIG. 7 shows another amplifier input stage 700. The amplifier input stage 700 includes all of the components of the amplifier input stage 500 of FIG. 5, and these components are given the same reference numerals. In addition, the input stage 700 includes additional components comprising active load devices on each of the four outputs 508, 510, 518 and 520. In FIG. 7, a portion of the amplifier input stage 700 is designated as a bias block 714. In some applications, the amplifier input stage 700 together with a combining circuit, such as a portion of the combining stage 810 of FIG. 8, can serve as the input stage of an amplifier, such as the input stage 106 of the chopped amplifier 100 of FIGS. 1 to 3.

The illustrated amplifier input stage 700 includes, in addition to the components shown in FIG. 5, a PMOS transistor 702 with a source connected to the supply voltage Vdd, a drain connected to the fourth output 520, and a gate connected to the gate and drain of transistor 536. A further PMOS transistor 704 has a source connected to Vdd, a drain connected to the third output 518, and a gate connected to the gate and drain of transistor 536. The transistors 536, 702 and 704 are arranged such that half of the current through transistor 536 is mirrored through each of the transistors 702 and 704. In this way, the common mode current at the outputs 518 and 520 can be reduced or eliminated by the transistors 702 and 704 acting as active load devices.

The amplifier input stage 700 also includes a NMOS transistor 706 with a source connected to ground, a drain connected to the second output 510, and a gate connected to the gate and drain of a NMOS transistor 708. The transistor 708 has its source connected to ground and its gate and drain also connected to the drain of a PMOS transistor 710. The source of PMOS transistor 710 is connected to Vdd and its gate is connected to the gate and drain of transistor 524.

A further NMOS transistor 712 has a source connected to ground, a drain connected to the first output 508, and a gate connected to the gate and drain of transistor 708. The transistors 524, 706, 708, 710 and 712 are arranged such that half of the current through transistor 524 is mirrored through each of the transistors 706 and 712. In this way, the common mode current at the outputs 508 and 510 can be reduced or eliminated by the transistors 706 and 712 acting as active load devices.

In other embodiments, for example where the current mirror of transistors 522 and 524 does not have a 1:1 ratio, or where the current mirrors of transistors 530, 532, 534 and 536 do not have a 1:1 ratio, current provided by transistors 702, 704, 706 and/or 712 may not be half of the current through the respective transistor 536 or 524, but instead may be some other proportion as appropriate.

Figure 8:
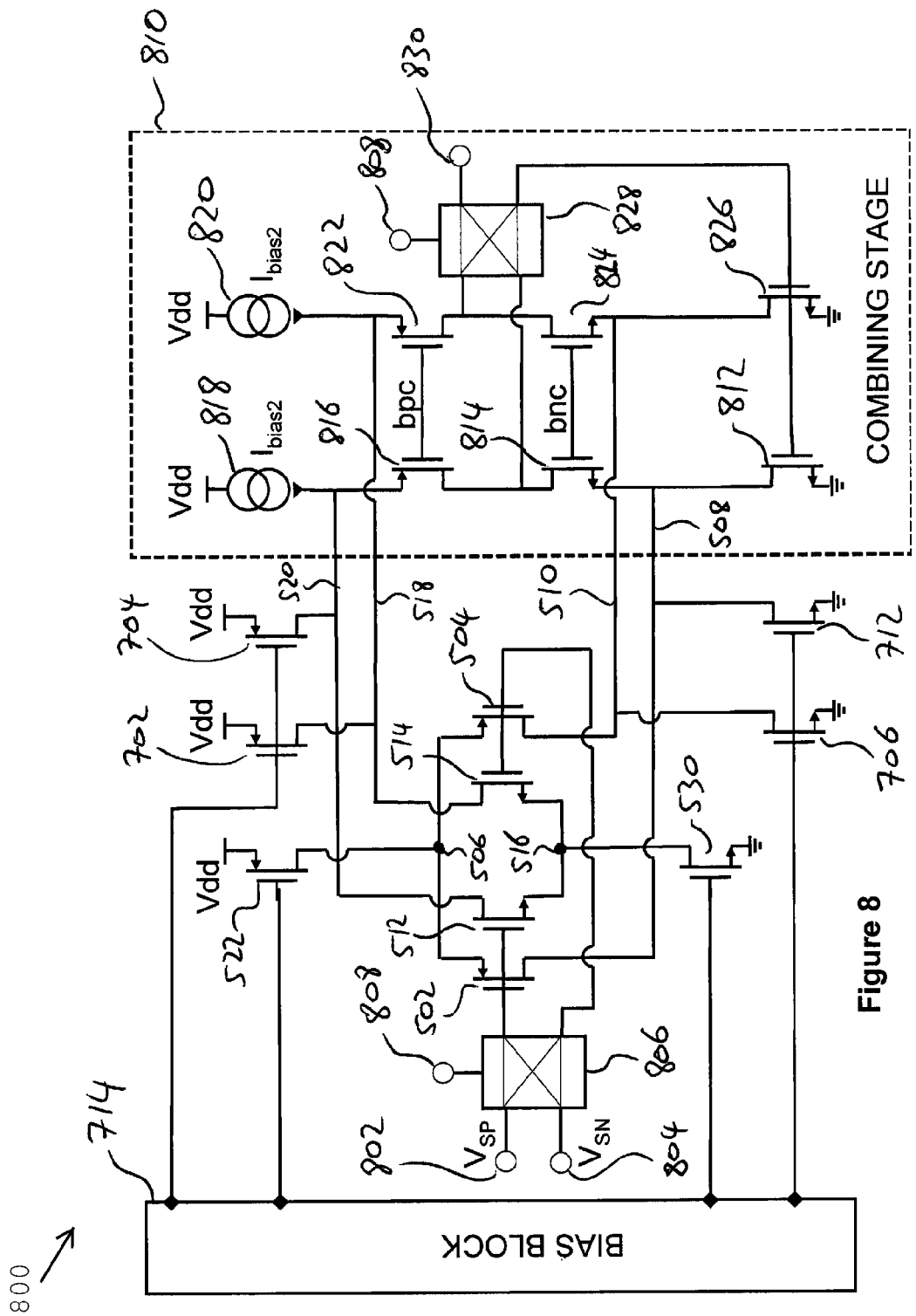
FIG. 8 shows a further example of a chopped amplifier.

FIG. 8 shows an example of a chopped amplifier 800. The chopped amplifier 800 includes the amplifier input stage 700 of FIG. 7, and like components are given the same reference numerals, though some components are represented by the bias block 714 (shown in FIGS. 7 and 8) for clarity. In other embodiments, a chopped amplifier may include the input stage 500 from FIG. 5, or any other appropriate configuration of the input stage, in combination with a combining stage, such as the combining stage 810.

The chopped amplifier 800 includes input terminals 802 and 804 for receiving input signals $V_{SP}$ and $V_{SN}$, respectively. These signals are provided to a first chopper 806 that also receives a chopping signal 808. The signal $V_{SP}$ can also be provided (not shown in FIG. 8) to the gate of the transistor 538 inside the bias block 714. In FIG. 8, a first output of the chopper 806 is provided to the gates of transistors 502 and 512. As also shown in FIG. 8, a second output of the chopper 806 is provided to the gates of transistors 504 and 514.

The chopped amplifier 800 includes a combining stage 810 that combines the outputs 508, 510, 518 and 520. The portion of the combining stage 810 that receives four output signals from the amplifier input stage and provides differential input signals to the chopper 828 can be referred to as a combining circuit. The first output 508 of the amplifier input stage is connected to the drain of a NMOS transistor 812. The source of transistor 812 is connected to ground. The first output is also connected to the source of NMOS transistor 814. The drain of transistor 814 is connected to the drain of PMOS transistor 816. The source of transistor 816 is connected to the fourth output 520 of the input stage. A bias current source 818 supplying bias current $I_{bias2}$ is connected between the supply voltage Vdd and the fourth output 520.

A further bias current source 820 is connected between Vdd and the third output 518 of the input stage. The third output 518 is also connected to the source of PMOS transistor 822, the drain of which is connected to the drain of NMOS transistor 824. The source of transistor 824 is connected to the drain of transistor 826, the source of which is connected to ground. The gates of transistors 816 and 822 are connected to each other, and similarly the gates of transistors 814 and 824 are connected to each other. The drains of transistors 814 and 816 are connected to the first input of a further chopper 828, and the drains of transistors 822 and 824 are connected to the other input of the chopper 828. One output of the chopper 828 provides an output terminal 830 from the chopped amplifier 800, and the other output is connected to the gates of transistors 812 and 826. The chopper 828 can be driven by the same signal 808 that drives the first chopper 806.

A bias circuit (not shown) provides a bias voltage bpc to the cascode devices 816 and 822 and a further bias circuit (not shown) provides a bias voltage bnc to the cascode devices 814 and 824.

The amplifier 800 shown in FIG. 8 can be configured as shown in FIG. 1 or can be used in any other suitable chopped amplifier configuration.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

Although methods, devices and electronic components have been disclosed in the context of certain preferred embodiments and examples, it will be understood by those skilled in the art that this disclosure extends beyond the specifically disclosed embodiments to other alternative embodiments and/or uses and modifications and equivalents thereof. In addition, while several variations have been shown and described in detail, other modifications, which are within the scope of this disclosure, will be readily apparent to those of skill in the art. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the disclosed embodiments. Thus, it is intended that the scope of the present invention herein disclosed should not be limited to the particular disclosed embodiments described above, but should be determined by a fair reading of the claims that follow.

What is claimed is:

1. An amplifier input stage comprising:
   first and second p-type transistors, wherein sources of the first and second p-type transistors are connected to a first node, a drain of the first p-type transistor is connected to a first output of the amplifier input stage, a drain of the second p-type transistor is connected to a second output of the amplifier input stage, a gate of the first p-type transistor is configured to receive a first signal of an input stage differential input signal and a gate of the second p-type transistor is configured to receive a second signal of the input stage differential input signal;
   first and second n-type transistors, wherein sources of the first and second n-type transistors are connected to a second node, a drain of the first n-type transistor is connected to a third output of the amplifier input stage, a drain of the second n-type transistor is connected to a fourth output of the amplifier input stage, a gate of the first n-type transistor is configured to receive the first signal of the input stage differential input signal and a gate of the second n-type transistor is configured to receive the second signal of the input stage differential input signal;

a first circuit arranged to provide a first portion of a first bias current to the first node; and a second circuit arranged to draw a second portion of the first bias current from the second node;

wherein rates at which the first and second portions change are determined by a slope of a first signal of an amplifier input signal.

2. The amplifier input stage of claim 1, wherein the first bias current is substantially fixed and/or consists essentially of the first portion and the second portion.

3. The amplifier input stage of claim 1, wherein the first and second portions of the first bias current are independent of at least one of the second signal of the differential input signal and a common mode of the differential input signal.

4. The amplifier input stage of claim 1, wherein at least one of the first and second circuit comprises at least one current source.

5. The amplifier input stage of claim 1, wherein the first circuit comprises at least one first current mirror and the second circuit comprises at least one second current mirror.

6. The amplifier input stage of claim 5, further comprising a third circuit arranged to determine the first and second portions of the bias current, the third circuit comprising:

a current source electrically coupled to a third node; and third and fourth transistors of a same conductivity type;

wherein the third and fourth transistors are connected to the third node;

wherein the third transistor is connected to the at least one first current mirror;

wherein the fourth transistor is connected to the at least one second current mirror; and wherein the at least one first current mirror is arranged to induce the first portion of the first bias current proportional to a current flowing through the third transistor, and the at least one second current mirror is arranged to induce the second portion of the first bias current proportional to a current flowing through the fourth transistor.

7. The amplifier input stage of claim 6, wherein the same conductivity type is n-type;

wherein a gate of the third transistor is connected to a threshold voltage; and wherein a gate of the fourth transistor is connected to the first signal of the amplifier input signal.

8. The amplifier input stage of claim 1, further comprising at least one of:

a first active load p-type transistor with a source connected to a first power supply voltage, a drain connected to the fourth output of the amplifier input stage, and a gate connected to the second circuit, wherein the second circuit and the first active load p-type transistor are arranged to provide substantially half of the second portion of the first bias current to the fourth output of the amplifier input stage;

a second active load p-type transistor with a source connected to the first power supply voltage, a drain connected to the third output of the amplifier input stage, and a gate connected to the second circuit, wherein the second circuit and the second active load p-type transistor are arranged to provide substantially half of the second portion of the first bias current to the third output of the amplifier input stage;

a first active load n-type transistor with a source connected to a second power supply voltage, a drain connected to the second output of the amplifier input stage, and a gate connected to the first circuit, wherein the first circuit and the first active load n-type transistor are arranged to draw substantially half of the first portion of the first bias current from the second output of the amplifier input stage; and a second active load n-type transistor with a source connected to the second power supply voltage, a drain connected to the first output of the amplifier input stage, and a gate connected to the first circuit, wherein the first circuit and the second active load n-type transistor are arranged to draw substantially half of the first portion of the first bias current from the first output of the amplifier input stage.

9. An amplifier comprising:

an amplifier input stage comprising:

first and second p-type transistors, wherein sources of the first and second p-type transistors are connected to a first node, a drain of the first p-type transistor is connected to a first output of the amplifier input stage, a drain of the second p-type transistor is connected to a second output of the amplifier input stage, a gate of the first p-type transistor is configured to receive a first signal of an input stage differential input signal and a gate of the second p-type transistor is configured to receive a second signal of the input stage differential input signal;

first and second n-type transistors, wherein sources of the first and second n-type transistors are connected to a second node, a drain of the first n-type transistor is connected to a third output of the amplifier input stage, a drain of the second n-type transistor is connected to a fourth output of the amplifier input stage, a gate of the first n-type transistor is configured to receive the first signal of the input stage differential input signal and a gate of the second n-type transistor is configured to receive the second signal of the input stage differential input signal;

a first circuit arranged to provide a first portion of a first bias current to the first node; and a second circuit arranged to draw a second portion of the first bias current from the second node;

wherein rates at which the first and second portions change are determined by a slope of a first signal of an amplifier input signal; and a further amplifier stage coupled to the first, second, third and fourth outputs of the amplifier input stage.

10. The amplifier of claim 9, wherein the first bias current is substantially fixed and/or consists essentially of the first portion and the second portion.

11. The amplifier of claim 9, wherein the first and second portions of the first bias current are independent of at least one of the second signal of the differential input signal and a common mode of the differential input signal.

12. The amplifier of claim 9, wherein the amplifier is an operational amplifier.

13. An electronic device including the amplifier of claim 9.

14. A chopper amplifier comprising:

a first chopper configured to receive first and second inputs, wherein the first input comprises a first signal of an amplifier input signal, and to provide first and second outputs, wherein the first chopper selectively reverses the order of the first and second inputs at the first and second outputs;

an amplifier as claimed in claim 9, the amplifier configured to receive the first and second outputs of the first chopper and provide first and second amplifier outputs; and a second chopper configured to receive the first and second amplifier outputs and to provide first and second outputs, wherein the second chopper selectively reverses the order of the first and second amplifier outputs at the first and second outputs of the second chopper.

15. The chopper amplifier of claim 14, wherein the first and second choppers are synchronously controlled.

16. The amplifier input stage of claim 1, wherein the first signal of the amplifier input signal is coupled to a gate of an input transistor, wherein the input transistor is coupled to a current source.

17. The amplifier input stage of claim 1, wherein the first signal of the amplifier input signal is coupled to a gate of an input transistor, the amplifier input stage further comprising:
a current source coupled to the input transistor, the current source also being coupled to a threshold transistor;
a first current mirror coupled to the input transistor; and
a second current mirror coupled to the threshold transistor.

18. An amplifier input stage comprising:
first and second p-type transistors, wherein sources of the first and second p-type transistors are coupled to a first node, a drain of the first p-type transistor is coupled to a first output of the amplifier input stage, a drain of the second p-type transistor is coupled to a second output of the amplifier input stage, a gate of the first p-type transistor is configured to receive a first signal of an input stage differential input signal and a gate of the second p-type transistor is configured to receive a second signal of the input stage differential input signal;
first and second n-type transistors, wherein sources of the first and second n-type transistors are coupled to a second node, a drain of the first n-type transistor is coupled to a third output of the amplifier input stage, a drain of the second n-type transistor is coupled to a fourth output of the amplifier input stage, a gate of the first n-type transistor is configured to receive the first signal of the input stage differential input signal and a gate of the second n-type transistor is configured to receive the second signal of the input stage differential input signal;
a first circuit arranged to source a first portion of a first bias current to the first node; and
a second circuit arranged to source a second portion of the first bias current to the second node; and
a third circuit arranged to determine the first and second portions of the bias current, the third circuit comprising:
a current source electrically coupled to a third node;
third and fourth transistors of a same conductivity type, the third and fourth transistors each coupled to the third node;
wherein the first and second portions of the bias current are determined at least partly by an amplifier input signal applied to a gate of the third transistor;
wherein the first portion of the bias current is proportional to a current flowing through the third transistor; and
wherein the second portion of the bias current is proportional to a current flowing through the fourth transistor.

19. The amplifier input stage of claim 18, wherein:
the first circuit comprises a first current mirror, the first current mirror being coupled to the third transistor;
the second circuit comprises a second current mirror, the second current mirror being coupled to the fourth transistor; and
the first current mirror is arranged to induce the first portion of the first bias current proportional to the current flowing through the third transistor, and the second current mirror is arranged to induce the second portion of the first bias current proportional to the current flowing through the fourth transistor.

20. The amplifier input stage of claim 18, wherein the same conductivity type is n-type.

* * * * *